United States Patent [19]

Werner

[11] 4,220,961
[45] Sep. 2, 1980

[54] MONOLITHIC COMBINATION OF TWO COMPLEMENTARY BIPOLAR TRANSISTORS

[75] Inventor: Wolfgang Werner, Munich, Fed. Rep. of Germany

[73] Assignee: Siemens Aktiengesellschaft, Berlin & Munich, Fed. Rep. of Germany

[21] Appl. No.: 971,007

[22] Filed: Dec. 19, 1978

[30] Foreign Application Priority Data

Dec. 23, 1977 [DE] Fed. Rep. of Germany ....... 2757762

[51] Int. Cl.² ............................................ H01L 27/02
[52] U.S. Cl. ...................................... 357/46; 357/59; 357/92
[58] Field of Search ............................. 357/46, 59, 92

[56] References Cited

PUBLICATIONS

Jour. Solid State Circuits—Oct. 1975, vol. SC-10, pp. 343–348 "Schottky 12L"—Hewlett.
IEEE Inter. Solid State Circuits Conf.—Feb. 1975, pp. 172–173.

*Primary Examiner*—Edward J. Wojciechowicz
*Attorney, Agent, or Firm*—Hill, Van Santen, Steadman, Chiara & Simpson

[57] ABSTRACT

In the production of integrated I²L-circuits, a lateral transistor and a vertical transistor are generated next to one another on the surface of a monocrystalline semiconductor body. Thereby, it is seen to that the base zone of the vertical transistor coincides with the collector zone of the lateral transistor and the base zone of the lateral transistor coincides with the emitter zone of the vertical transistor. Further, it is known to provide at least one collector zone of monocrystalline semiconductor material belonging to the vertical transistor and marked off from the base zone of this transistor by a pn-junction and to provide a Schottky contact as collector electrode.

The invention makes provisions for applying a polycrystalline layer of the same semiconductor material and the doping of the collector zone on the surface of the monocrystalline collector zone and then making this the carrier of the collector electrode or collector electrodes, respectively.

In addition to reducing the effort otherwise required, an increase of the component density as well as a series of structural improvements can be attained.

13 Claims, 7 Drawing Figures

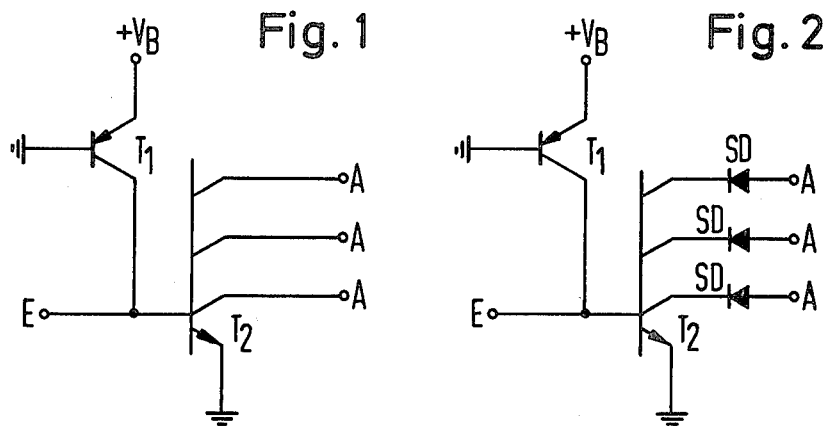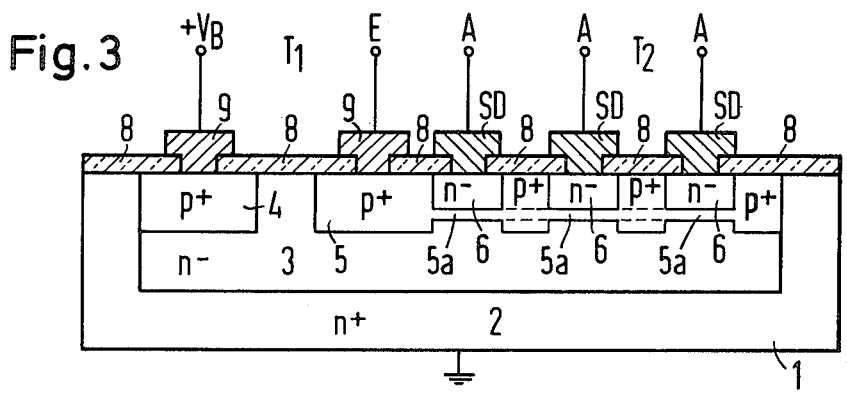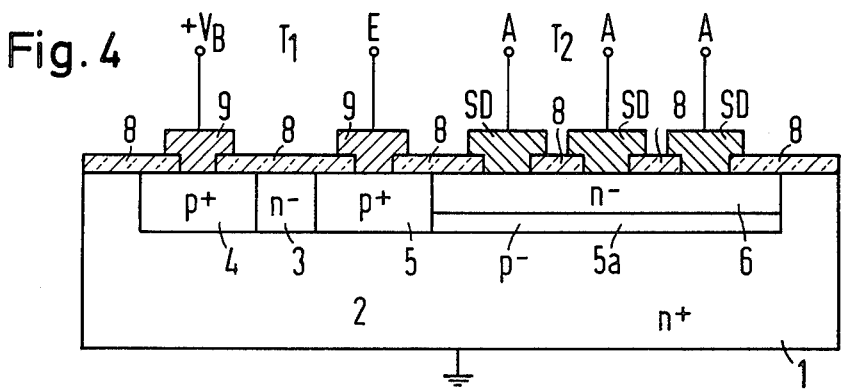

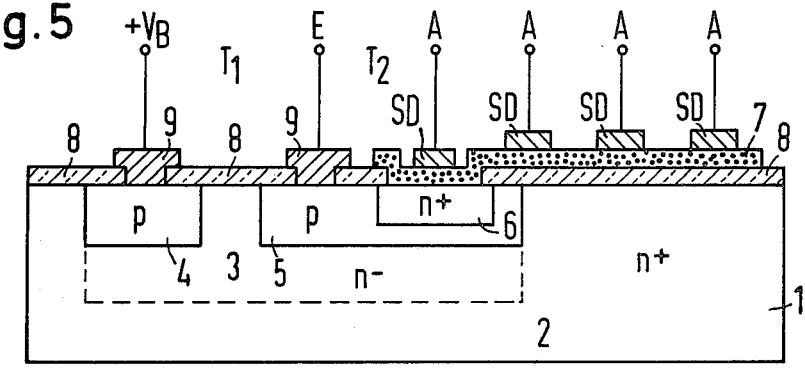
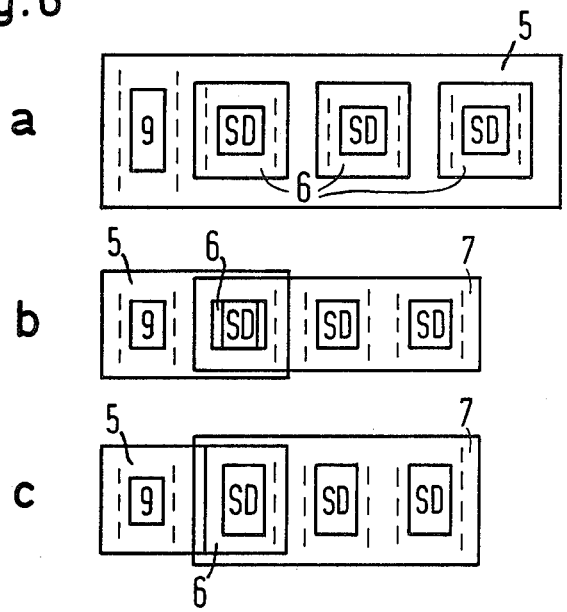
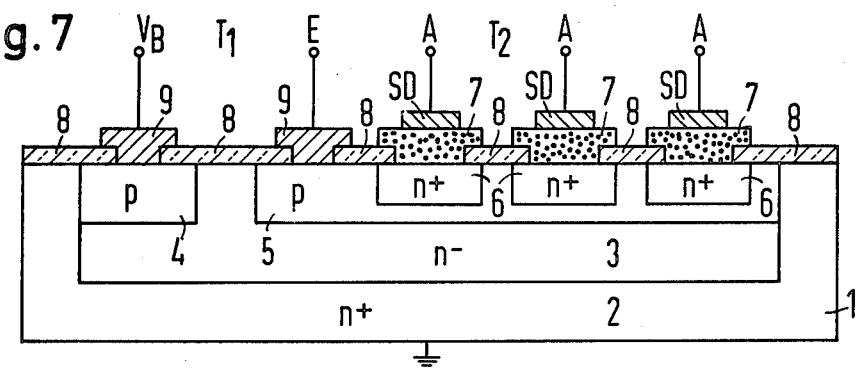

MONOLITHIC COMBINATION OF TWO COMPLEMENTARY BIPOLAR TRANSISTORS

INTRODUCTION

The invention relates to a monolithic combination of two complementary bipolar transistors, of which the one is formed as a lateral transistor, the other as a vertical transistor next to one another on the surface of a semiconductor monocrystal and in which both are designed in such a manner that the base zone of the vertical transistor coincides with the collector zone of the lateral transistor and the base zone of the lateral transistor coincides with the emitter zone of the vertical transistor; in which, moreover, at least one collector zone of monocrystalline semiconductor material is provided, which collector zone belongs to the vertical transistor and is marked off from the base zone of this transistor by means of a pn-junction; and in which a Schottky contact is provided as the collector electrode.

BACKGROUND OF THE INVENTION

1. Field of the Invention

This invention relates to integrated injection logic ($I^2L$) which is a digital circuit technique in which base drive is injected into the base of the switching transistor from an adjacent pn diode. This technique permitted higher functional density and improved power delay efficiency which made it attractive for large scale integration (LSI).

2. Description of the Prior Art

The monolithic combination of two complementary bipolar transistors in which one is formed as a lateral transistor and the other as a vertical transistor next to each other on the surface of a semiconductor monocrystal is known in the art. It is further known in the art that this structure may be further improved by making the collector contacts Schottky contacts. See, for example, the article by Frank W. Hewlett entitled "Schottky $I^2L$" in the Journal of Solid State Circuits, October, 1975, Volume SC-10, pages 343-348.

More specifically, this structure is a monolithic combination of complementary transistors of which one is formed as a lateral transistor, and the other is a vertical transistor on the surface of a semiconductor monocrystal, and in which both are designed in such a manner that the base zone of the vertical transistor coincides with the emitter zone of the lateral transistor, and that the base zone of the lateral transistor coincides with the emitter zone of the vertical transistor, and is marked off from the base zone of this transistor by means of a pn junction.

In the monolithic transistor combination described above, the Schottky collector electrodes are formed directly on the monocrystalline material of the collector zone. See also the prior art disclosure, 1975 IEEE International Solid State Circuits Conference, Feb. 14, 1975, pages 172-173.

SUMMARY OF THE INVENTION

Instead of the $I^2L$ arrangement above referred to, in accordance with the present invention, it is proposed to design the monolithic combination defined above in such a manner that the monocrystalline collector zone of the vertical transistor is enlarged by a layer of polycrystalline semiconductor material of the conduction type of the monocrystalline collector zone and the collector electrode designed as a Schottky contact is formed on the surface of the polycrystalline semiconductor layer.

Thereby, the following advantages over the known monolithic combinations of the type initially referred to can be achieved:

(a) The monolithic combination can be more simply produced than in the known arrangements of this type, since, by contrast to the production of known arrangements, no 600 KeV implantation is necessary;

(b) The polycrystalline silicon layer can assume the function of a second metallisation layer (c) A higher component density can be attained than in the utilization of the known construction;

(d) Upon use of a common monocrystalline collector area for a plurality of collector connections, the monocrystalline collector area and, thus, also the base zone of the vertical transistor can be significantly reduced with respect to their lateral extent in comparison to the corresponding collector area of the known arrangements, which means a corresponding reduction of the diffusion and depletion layer capacitances. Moreover, the size of the vertical transistor can be reduced to the size of a minimum transistor.

BRIEF DESCRIPTION OF THE DRAWINGS

Further details of the invention, as well as the presentation of the relevant prior art and the substantiation of the indicated advantages are provided on the basis of the circuit diagrams and the diagrammatic views, partly in section appearing in FIGS. 1 through 7. Thereby, FIGS. 1 through 4 refer to known arrangements, FIG. 6 refers partially to known arrangements and partially to the invention, and the remaining Figures refer exclusively to the invention.

DESCRIPTION OF THE PREFERRED EMBODIMENTS

The equivalent circuit of a monolithic combination of two complementary bipolar transistors corresponding with a single exception of the definition initially given is shown in FIG. 1. The exception consists therein that the collector electrodes are designed as ohmic contacts in the manner usual in $I^2L$-gates and not as Schottky contacts. According to the equivalent circuit illustrated in FIG. 1, the collector of a pnp-transistor $T_1$ is applied to the base of an npn-transistor $T_2$ which exhibits a plurality of collector outputs A, whereas the emitter of the transistor $T_2$ and the base of the transistor $T_1$ have identical potential. This is the result of the identity of the base zone of the lateral transistor $T_1$ with the emitter zone of the vertical transistor $T_2$ and the identity of the collector zone of the lateral transistor $T_1$ with the base zone of the vertical transistor $T_2$. The connection E can serve as the input of the gate, whereas the collector outputs A of the vertical transistor $T_2$ can form the outputs of the logical gate.

The use of a Schottky contact electrode SD as the connection to the collector zone of the vertical transistor $T_2$ causes the change of the equivalent circuit to be seen in FIG. 2, in that, for each Schottky contact provided as a collector electrode, a respective Schottky diode SD appears in the equivalent circuit.

The realization of the circuit illustrated in FIG. 2 by means of a known monolithic combination can occur in the manner to be seen in FIG. 3 or in FIG. 4, whereby one usually provides not only one but a plurality (in the illustrated sample case, 3) of Schottky contact collector electrodes SD. Thereby, the possibility exists for providing a respective monocrystalline collector zone for each Schottky contact electrode SD, or the possibility for providing a common monocrystalline collector zone of the vertical transistor $T_2$ for all Schottky contact electrodes SD. The first case is illustrated in FIG. 3, the second in FIG. 4.

In the production of monolithic transistor combinations of the type initially described, one usually forms these in a monocrystalline semiconductor layer of weak doping, particularly with n-doping, which is epitaxially deposited on a semiconductor crystal of the same semiconductor material which at least on its surface exhibits a conduction type corresponding to the conduction type of the epitaxial monocrystalline semiconductor layer of weak doping, whereby, however, the doping concentration on the surface of the substrate is adjusted significantly higher than that in the epitaxial layer. This circumstance is accounted for in FIGS. 3 and 4, as well as in the following Figures by the n+ doped zone 2, in which the combination of the two transistors $T_1$ and $T_2$ is more or less embedded. The weakly doped area 3 exhibiting the same conduction type as the zone 2 forms the base zone of the lateral transistor $T_1$ and the emitter zone of the vertical transistor $T_2$. In the example of FIG. 3, the p+ doped emitter zone 4 and the p+ doped collector zone 5 of the lateral transistor $T_1$ is let into the surface of the area 3, whereas in the example of FIG. 4, the weakly doped area 3 (the actual base of the lateral transistor $T_1$) lies exclusively between the emitter 4 and the collector 5 of $T_1$.

The base zone of the vertical transistor $T_2$ and the collector zone of the lateral transistor $T_2$ from a coherent area of the same conduction type, whereby, however, the doping of the base zone $5a$ of $T_2$ is adjusted lower than the doping of the collector zone 5 of $T_1$. In the example of FIG. 3, each Schottky contact collector electrode SD has a respective monocrystalline collector zone 6 allocated to it; in the example of FIG. 4, the totality of the Schottky contact collector electrodes SD of the transistor combination has only a single monocrystalline collector zone 6 allocated to it. The arrangements according to both FIGS. 3 and 4 are completed by an insulating protective layer 8, consisting preferably of $SiO_2$, and the depletion-free connections 9 for the emitter and the collector of the lateral transistor $T_1$. The bias voltage for the emitter of the vertical transistor $T_2$ or for the base of the lateral transistor $T_1$, respectively, is delivered via the area 2.

The surface of the collector zones of the vertical transistor $T_2$ must be weakly doped (about $10^{16} cm^{-3}$), so that the collector electrode can be worked out as a Schottky contact SD. The resulting effect is that the active area of the base of the vertical transistor must be p$^-$ doped and, therefore, can only be produced by means of ion implantation technology. Because of the required penetration depth, acceleration energies in the magnitude of 600 keV are required for this. (The measure of generating the emitter zone 4 and the collector zone 5 of the lateral transistor $T_1$ in temporal succession is not to be recommended for technical reasons of adjustment.)

If, on the other hand, the doping of collector zone 6 of the vertical transistor $T_2$ is increased, i.e., to the n+ type, then the necessary doping of the collector zone 6, which requires a two-time re-doping of the epitaxial layer which accepts the transistor combination and exhibits the doping of the area 3, can ensue in a conventional manner, thus, for example, by means of diffusion.

This is the case in the embodiment illustrated in FIG. 5, and corresponding to the invention. Its realization ensues expediently with the use of silicon as the semiconductor material.

The doner-doped zone of the silicon monocrystal 1 which assumes the function of the emitter zone of the vertical transistor $T_2$ as well as the function of the base zone of the lateral transistor $T_1$ consists of an n+ doped part 2 (i.e., exhibiting a donor concentration of about $10^{18}$ or $10^{19} cm^{-3}$, respectively), and a weakly doped part 3 (with about $10^{16} cm^{-6}$).

In production, one proceeds in the usual manner as follows: proceeding from a p-doped disk-shaped silicon monocrystal 1, first a highly doped n+ zone 2 is formed at the place where the transistor combination is to be created which zone 2 is then in turn covered with a weakly n doped monocrystalline silicon layer by means of precipitation from the gaseous phase, whose doping corresponds to the doping desired for the area 3.

In this epitaxial zone, the p doped emitter zone 4, the p doped collector zone 5 of the lateral transistor $T_1$ and the p doped base zone of the vertical transistor $T_2$ are now produced by means of localized redoping. The production of an arrangement corresponding to the invention, in contrast to the production of the known arrangements according to FIGS. 3 and 4, requires no weakly doped base zone for the vertical transistor, since the collector zone 6 of $T_2$ to be generated in the area of the base zone of the vertical transistor $T_2$, in contrast to the known arrangements according to FIGS. 3 and 4, can be highly doped, i.e., can be n+ doped. For this reason, the acceptor-doped zone representing the collector zone of the lateral transistor $T_1$ as well as the base of the vertical transistor $T_2$ can be produced in a single process step, for example, by means of diffusion, whereas in the production of the known arrangements, a special base area $5a$ must be created for the vertical transistor $T_2$. By means of a further redoping of a part of the zone 5, an n+ doped collector zone 6 for the vertical transistor $T_2$ arises.

The insulating protective layer 8 consisting particularly of $SiO_2$ provided on the surface of the epitaxial silicon layer is formed by the doping mask used in the production of the collector zone 6 of the vertical transistor $T_2$.

Of significance is the layer 7 of doped polycrystalline silicon which is to be provided in an arrangement according to the invention, whose conduction type corresponds to that of the monocrystalline collector zone 6 of the vertical transistor $T_2$. The doping concentration of the polysilicon layer 7 is adjusted so low that the application of Schottky contacts SD on it is possible. Thus, it is adjusted to a maximum of circa $10^{16} cm^{-3}$.

The production of the polycrystalline silicon layer 7 occurs in the usual manner, for example, by means of gas discharge atomizing or by means of vaporization using electron beam guns or by means of precipitation from a suitable reaction gas, for example, by means of heating in a $SiH_4$ atmosphere diluted with argon or hydrogen. The Schottky contacts SD, i.e., the collector electrodes of the vertical transistor $T_2$, are applied in the same manner as though the polysilicon layer 7 were monocrystalline.

After generating the electrodes SD and the electrodes 9, the arrangement illustrated in cross section in FIG. 5 can be covered with a further insulating layer, which in turn can be made into the carrier for the tracks required for the external contacting.

As the metal for the Schottky collector electrodes SD in the example, aluminum or a PtSi-TiW-Al-layer series can be used, which is also applicable for the electrodes 9. If, in addition, a Schottky-contact-free connection is to be generated on the polycrystalline silicon layer 7, then the donor concentration of the location of the polycrystalline silicon layer 7 provided for the location for the connection in question must be locally increased, so that the occurrence of a Schottky contact at the location of layer 7 concerned is no longer possible. If, deviating from the sample embodiments, the collector zone 6 is p-conductive, then the Schottky contacts SD can be generated on the appertaining polycrystalline silicon layer by using hafnium or zircon as the contact metal.

Significant additions are:

1. As can be seen from FIG. 5, a polycrystalline silicon layer 7 with a plurality of Schottky collector electrodes SD can belong to a collector zone 6. The other case, namely that each monocrystalline collector zone 6 is provided with one respective polycrystalline layer 7 and this, in turn, is provided with one respective Schottky collector electrode SD, is shown in FIG. 7.

2. For the purpose of reducing its lateral resistance, the polycrystalline silicon layer 7 can exhibit an increased doping to the side of the Schottky contact SD. For example, a lower layer part can be doped more highly than the upper layer part forming the Schottky contact. Instead of that, under certain conditions, an after-treatment that does not influence the quality of the Schottky contact SD can be applied in doping atmosphere or by means of ion implantation after the generation of the Schottky contact electrodes SD.

A comparison of FIGS. 3 and 5 shows particularly clearly that the dimensions of the base of the vertical transistor $T_2$, and, thus, the dimensions of the layout of the $I^2L$ gate can be markedly reduced. In order to show this even more clearly, in FIG. 6, the layout of an arrangement according to FIG. 3 (FIG. 6a) is compared with the layout of an arrangement according to FIG. 5 (FIG. 6b or 6c, respectively). Whereas an arrangement according to FIG. 3 has the surface need of monocrystalline semiconductor material illustrated in FIG. 6a by the rectangular border for the transistor $T_2$, the analogous need of an arrangement according to FIG. 5 is shown by the left hand rectangular border of FIGS. 6b and 6c and can be reduced in comparison to an arrangement according to FIG. 3 to at least one-third. Thereby, the depletion layer and the diffusion capacitances are also reduced, whereby the arrangement functioning, for example, as a NAND-gate receives noticeably smaller switching times. It should also be pointed out that the monocrystalline silicon area located under the polysilicon layer 7 and no longer required for the two transistors $T_1$ and $T_2$ is available for other purposes, for example, for the assumption of other functions of the monolithic combination.

It will be apparent to those skilled in the art that many modifications and variations may be effected without departing from the spirit and scope of the novel concepts of the present invention.

I claim as my invention:

1. A monolithic combination of two complementary bipolar transistors of which one is formed as a lateral transistor, and the other as a vertical transistor, next to one another on the surface of a semiconductor monocrystal and designed in such a manner that the base zone of the vertical transistor coincides with the collector zone of the lateral transistor, in which, at least one collector zone of said vertical transistor marked off from the base zone of said vertical transistor by means of a pn-junction and a Schottky contact forming a collector electrode, said monocrystalline collector zone of said vertical transistor being enlarged by a layer of polycrystalline semiconductor material of the same conductivity type as said monocrystalline collector zone and said collector electrode being a Schottky contact on the surface of said polycrystalline semiconductor layer.

2. A structure according to claim 1, in which said vertical transistor is of the npn-type, and the semiconductor material is silicon.

3. A structure according to claim 1, in which the doping concentration of said polycrystalline silicon layer is made smaller than said monocrystalline collector zone of said vertical transistor at least at the location of said Schottky contact.

4. A structure according to claim 1, in which said polycrystalline silicon layer is contacted by a plurality of electrodes, of which at least one is a Schottky contact.

5. A structure according to claim 1, in which said polycrystalline silicon layer consists of a lower layer part with higher doping concentration proceeding to the side of said collector electrodes with Schottky contact characteristics, and an upper layer part with lower doping concentration forming said Schottky contact.

6. A structure according to claim 1, in which said polycrystalline silicon layer with its collector electrodes is located primarily to the side of said monocrystalline collector zone on an insulation layer covering said monocrystalline surface.

7. A structure according to claim 1, in which said polycrystalline semiconductor layer consists of silicon applied by means of thermal precipitation of a reaction gas laced with a doping material.

8. A structure according to claim 7, in which said doping material is a mixture of an inert gas with $SiH_4$ and the hydrid of a doping material.

9. A structure according to claim 7, in which said polycrystalline semiconductor layer consisting of silicon is applied by means of gas discharge atomizing.

10. A structure according to claim 7, in which said polycrystalline semiconductor layer consisting of silicon is applied by means of electron beam evaporization.

11. A structure according to claim 1, in which said polycrystalline silicon semiconductor layer is covered with an insulation material.

12. The monolithic combination of two complementary bipolar transistors comprising a monocrystalline semiconductor body of one conductivity type, a lateral bipolar transistor formed in one surface thereof, having a base zone of said one conductivity type and a collector zone of the other of said conductivity types, an inverted vertical bipolar transistor formed in said surface of said semiconductor body adjacent said lateral transistor, said vertical transistor having a buried emitter zone of the same conductivity type as said base zone of said lateral transistor and having a plurality of collector zones of said one conductivity type at the surface of said body, said base zone of said vertical transistor coinciding with said collector zone of said lateral transistor, and said base zone of said lateral transistor coinciding with said emitter zone of said vertical transistor, at least one of said collector zones of said vertical transistor having a polycrystalline layer of semiconductor material thereon of said one conductivity type, and a Schottky collector contact on each of said polycrystalline layers.

13. A monolithic combination of two complementary bipolar transistors comprising a monocrystalline semiconductor body of one conductivity type, a lateral bipolar transistor formed in one surface thereof, having a base zone of said one conductivity type and a collector zone of the other of said conductivity types, an inverted vertical bipolar transistor formed in said surface of said semiconductor body adjacent said lateral transistor, said vertical transistor having a buried emitter zone of the same conductivity type as said base zone of said lateral transistor and having a plurality of collector zones of said one conductivity type at the surface of said body, said base zone of said vertical transistor coinciding with said collector zone of said lateral transistor, and said base zone of said lateral transistor coinciding with said emitter zone of said vertical transistor, said monocrystalline collector zones of said vertical transistor being enlarged by a layer of polycrystalline semiconductor material of said one conductiviey as said monocrystalline collector zone of said vertical transistor, and a plurality of Schottky collector contacts on said layer of polycrystalline material.

* * * * *